US006972598B2

(12) United States Patent
Yoo

(10) Patent No.: US 6,972,598 B2
(45) Date of Patent: Dec. 6, 2005

(54) METHODS AND ARRANGEMENTS FOR AN ENHANCED SCANABLE LATCH CIRCUIT

(75) Inventor: Seung-Moon Yoo, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 58 days.

(21) Appl. No.: 10/730,958

(22) Filed: Dec. 9, 2003

(65) Prior Publication Data

US 2005/0122136 A1 Jun. 9, 2005

(51) Int. Cl.[7] .......................................... H03K 19/096
(52) U.S. Cl. ........................ 326/95; 326/98; 326/114; 326/16; 714/726
(58) Field of Search ........................... 326/104, 93, 95, 326/98, 114, 56–58, 16; 327/208–212, 214, 327/215, 224, 225; 714/724–727

(56) References Cited

U.S. PATENT DOCUMENTS

| | | | |
|---|---|---|---|
| 4,780,666 A | 10/1988 | Sakashita et al. | |
| 5,227,674 A | 7/1993 | Takahashi et al. | |
| 5,233,638 A | 8/1993 | Moriwaki et al. | |
| 5,248,905 A | 9/1993 | Kuo | |
| 5,272,397 A * | 12/1993 | Chen et al. | 326/97 |
| 5,349,255 A | 9/1994 | Patel | |
| 5,656,962 A | 8/1997 | Banik | |
| 5,689,517 A | 11/1997 | Ruparel | |
| 5,925,143 A | 7/1999 | Gillis et al. | |
| 5,938,782 A | 8/1999 | Kay | |
| 5,973,529 A | 10/1999 | Chappell et al. | |
| 6,075,386 A * | 6/2000 | Naffziger | 326/98 |
| 6,240,536 B1 | 5/2001 | Mikan et al. | |
| 6,271,683 B1 * | 8/2001 | Horne et al. | 326/93 |
| 6,686,775 B2 * | 2/2004 | Campbell | 326/93 |

* cited by examiner

*Primary Examiner*—Vibol Tan
(74) *Attorney, Agent, or Firm*—Casimer K. Salys; Jeffrey S. Schubert

(57) ABSTRACT

Methods, and arrangements to enhance speed and reduce power consumption in a scanable latch circuit are disclosed. Embodiments include a wired-or circuit to facilitate independent paths for scan data and normal input data through the scanable latch circuit. In particular, to reduce delays related to gates between the input pin for the system clock and a normal input gate, dual, substantially independent paths are implemented: a scan path and a normal input path. Embodiments coordinate transmission of data from a normal input gate and a scan input gate to an output latch, a scan out pin, and/or combinational logic by incorporating buffers that isolate a wired-or node from either the scan input gate, the normal input gate, or both with a high impedance.

27 Claims, 6 Drawing Sheets

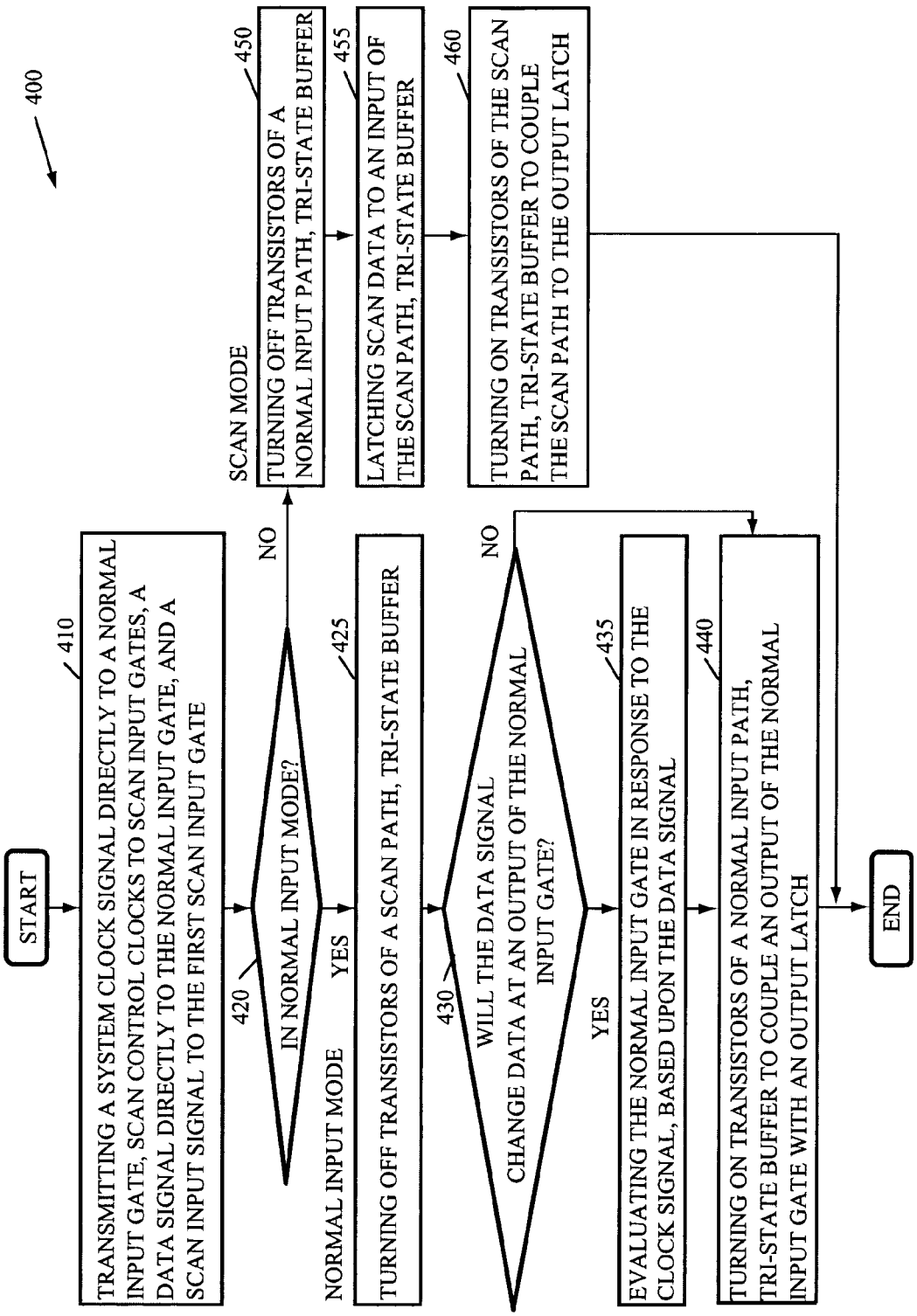

METHODS AND ARRANGEMENTS FOR AN ENHANCED SCANABLE LATCH CIRCUIT

FIELD OF INVENTION

The present invention is in the field of scanable latches. More particularly, the present invention relates to methods and arrangements to enhance speed and reduce power consumption in a scanable latch circuit by separating scan and normal input paths and by using a faster circuit topology for the normal input path.

BACKGROUND

The designs of many semiconductor integrated circuits incorporate failure diagnostics to assure that, e.g., combinational logic circuits are operating correctly, not only upon production but also throughout the life of the chip. One failure diagnostic technique, referred to as scan path design, propagates bit patterns through circuit elements and independently through a daisy chain of scanable latch circuits associated with the circuit elements. The scanable latch circuits include the latches necessary to coordinate transmission or propagation of data through various combinational logic circuits as well as scan path circuitry to coordinate evaluation of normal input with evaluation of the bit patterns for failure diagnostics.

Once a combinational logic circuit evaluates a bit pattern, the results are compared with expected results to determine whether circuit elements have failed, and, if so, which element(s). In scan path design, scanable latch circuits are arranged to form a series of linked shift registers for diagnostic purposes. The bit shift route through these linked scanable latch circuits is often referred to as a scan path. For example, chips such as microprocessors have a large number of latches to coordinate transmission of data from one stage to the next stage in, e.g., pipelines. Scanable latch circuits typically include a pair of latches in the scan path to synchronize incoming bit patterns to a particular clock signal. A first latch accepts a bit on one clock transition and transfers this bit to a second latch on the alternate clock transition.

The bit shift operation can serially supply diagnostic bit patterns to each of the latches in the scanable latch circuits. Then, the corresponding combinational logic is driven to evaluate the bit patterns from the latches. Analysis of the output is indicative of the proper operation of at least portions of the combinational logic because the states of the latches are known and the configuration of the combinational logic is known. Therefore, driving several different bit patterns with sufficient variety through the scanable latch circuits provides adequate information to determine whether combinational logic has failed.

Although the ability to scan test circuit elements in an integrated circuit simplifies diagnostic testing, there are drawbacks to scan path design. One such drawback is the effect of the additional scan path circuitry necessary to coordinate normal and diagnostic functions for the scanable latch circuits. In particular, generating gate clock signals based upon the system clock introduces several gate delays between the input pin of the system clock for the scanable latch circuit and the gate at the input of the combinational logic. As a result, performance of the scanable latch circuit is impacted by a minimum number of delays. In other words, the normal input data cannot be gated to the combinational logic until the normal input gate receives a transition of the system clock and if, for example, six gates reside between the input pin for the system clock and the normal input gate, such as in some conventional scanable latch circuits, six gates must change states before a transition of the system clock is recognized by the normal input gate. Further, after taking into account the delay of the normal input gate, data is delayed at least seven gate delays between receipt of the data at an input pin and the input for the combinational logic.

SUMMARY OF THE INVENTION

The problems identified above are in large part addressed by methods and arrangements for enhancing a scanable latch circuit. One embodiment provides a wired-or circuit for a scanable latch. The wired-or circuit contemplates a first latch coupled to latch a bit during a scan mode; a second latch; a first buffer coupled between the first latch and the second latch to propagate the bit via a scan input gate to the second latch during a scan mode and to substantially isolate the scan input gate from the second latch with a first high impedance during a normal input mode; and a second buffer coupled between the second latch and a normal input gate to propagate data from the normal input gate to the second latch during the normal input mode and to substantially isolate the normal input gate from the second latch with a second high impedance during the scan mode.

One embodiment provides a wired-or circuit for a scanable latch. The wired-or circuit contemplates an input latch to latch a bit to a scan path; an output latch having an input coupled with the scan path and a normal input path; a first buffer to couple the input latch via a scan input gate to the scan path; and a second buffer to couple an output of a normal input gate with the normal input path, wherein the first buffer is configured to remain in a high impedance state while data from the output of the normal input gate is propagated to the output latch via the normal input path and the second buffer is configured to remain in the high impedance state while the bit from the input latch is propagated to the output latch via the scan path.

Another embodiment provides a normal input gate for gating a data signal received by a scanable latch circuit to a latch of the scanable latch circuit. The wired-or circuit contemplates a pre-charge circuit to pre-charge a dynamic node before the data signal is evaluated; a logic transistor having a gate coupled with the data signal to discharge the dynamic node when the normal input gate is activated; and an output to couple a voltage source to a latch based upon a charge on the dynamic node.

A further embodiment provides a scanable latch circuit. The scanable latch circuit contemplates an output latch; an input latch having a scan data output; a normal input gate to output logic data based upon a data signal; and a wired-or circuit having a first buffer coupled between the output latch and the scan data output to transmit scan data to the output latch during a scan mode and to substantially isolate the output latch from the scan data output with a first high impedance during a normal input mode; and a second buffer coupled between the output latch and an output for the normal input gate to transmit the logic data to the output latch during the normal input mode and to substantially isolate the output latch from the output for the normal input gate with a second high impedance during the scan mode.

Another embodiment provides a method for switching between scan path and normal input path operations in a scanable latch circuit. The method generally includes transmitting a data signal to an input of a normal input gate; transmitting a system clock signal to the normal input gate via a path that is substantially independent of a path to a scan input gate; evaluating the data signal via the normal input gate; and turning on a transistor of a normal input, high impedance buffer to couple an output of the normal input gate to a latch and turning off transistors of a scan input, high impedance buffer, wherein the high impedance buffers are in a normal input mode.

BRIEF DESCRIPTION OF THE DRAWINGS

Other objects and advantages of the invention will become apparent upon reading the following detailed description and upon reference to the accompanying drawings in which, like references may indicate similar elements:

FIG. 4 depicts an example of a flow chart to enhance speed and reduce power consumption in a scanable latch circuit.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments, but on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, methods and arrangements to enhance speed and reduce power consumption in a scanable latch circuit are contemplated. Embodiments include a wired- or circuit to facilitate independent paths for scan data and normal input data through the scanable latch circuit. In particular, to reduce delays related to gates between the input pin for the system clock and a normal input gate, dual, substantially independent paths are implemented: a scan path and a normal input path. Embodiments coordinate transmission of data from a normal input gate and a scan input gate to an output latch, a scan out pin, and/or combinational logic by incorporating buffers that isolate a wired-or node from either the scan input gate, the normal input gate, or both with a high impedance.

The buffers, hereinafter referred to as tri-state buffers, prevent or significantly reduce the ground currents and current loops between the output of the normal input gate and the output of the scan input gate. The buffers are designed to cooperatively function such that when the scan input gate is transferring data to the output latch (via the scan path), the tri-state buffer at the output of the normal input gate is perceived as a high impedance by the output latch. Thus, the output of the normal input gate does not affect transmission of data via scan input gate to the output latch. Similarly, the tri-state buffer at the output of the scan input gate does not affect the transmission of normal input data from the normal input gate to the output latch.

While specific embodiments will be described below with reference to particular circuit configurations of a tri-state buffer, wired-or circuitry, and other components, those of skill in the art will realize that embodiments of the present invention may advantageously be implemented with other circuit configurations. In particular, while a tri-state buffer is discussed throughout the disclosure as a three state buffer, buffers based upon other circuit configurations that have two or more states for isolating the scan and normal input paths are contemplated.

Figure 1A:
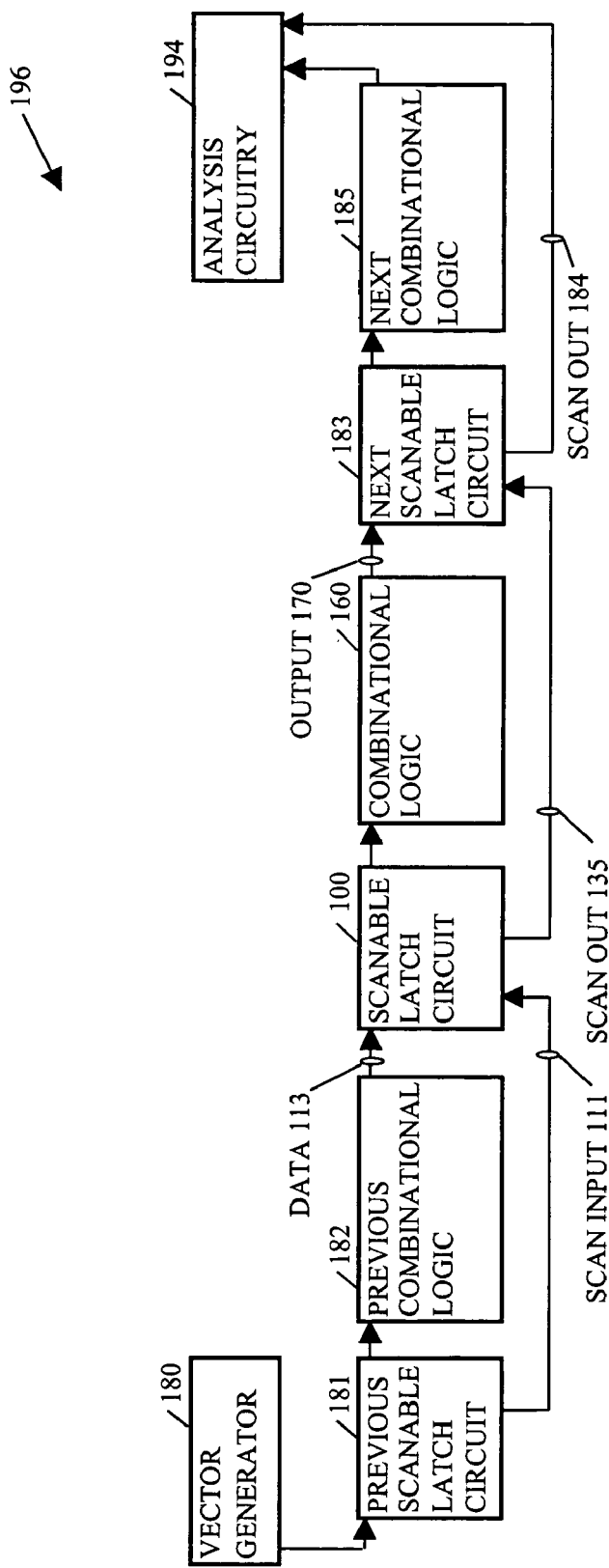
FIG. 1A depicts an embodiment of system for scan testing combinational logic via scanable latch circuits.

Turning now to the drawings, FIG. 1A depicts an embodiment of a system 196 for scan testing combinational logic via scanable latch circuits. In particular, vector generator 180 generates multiple bit patterns to determine whether combinational logic 182, 160, and 185 are erroneously evaluating the data. The bit patterns, for example, may be designed to test every possible evaluation by combinational logic 160.

As vector generator 180 generates bit patterns, the bit patterns are serially gated through to latches of scanable latch circuit 100 via scan input 111 and then, on to the next scanable latch circuit 183 via scan out 135. Note that the bit patterns are transferred from the previous scanable latch circuit 181 to scanable latch circuit 100 and from scanable latch circuit 100 to the next scanable latch circuit 183 without changing the patterns. As such, the states of the latches are known once the bit pattern is transferred to scanable latch circuit 100. Upon evaluating the bit patterns via combinational logic 160, the output 170 from combinational logic 160 is captured via data capture circuitry of the next scanable latch circuit 183 and then transferred to analysis circuitry 194 via the scan out 184. The bit pattern evaluated by combinational logic 160 to generate output 170 is also transmitted to analysis circuitry 194 via scan out 135 and scan out 184 to determine whether the output of combinational logic 160 is erroneous in light of the bit pattern evaluated by combinational logic 160.

Figure 1B:
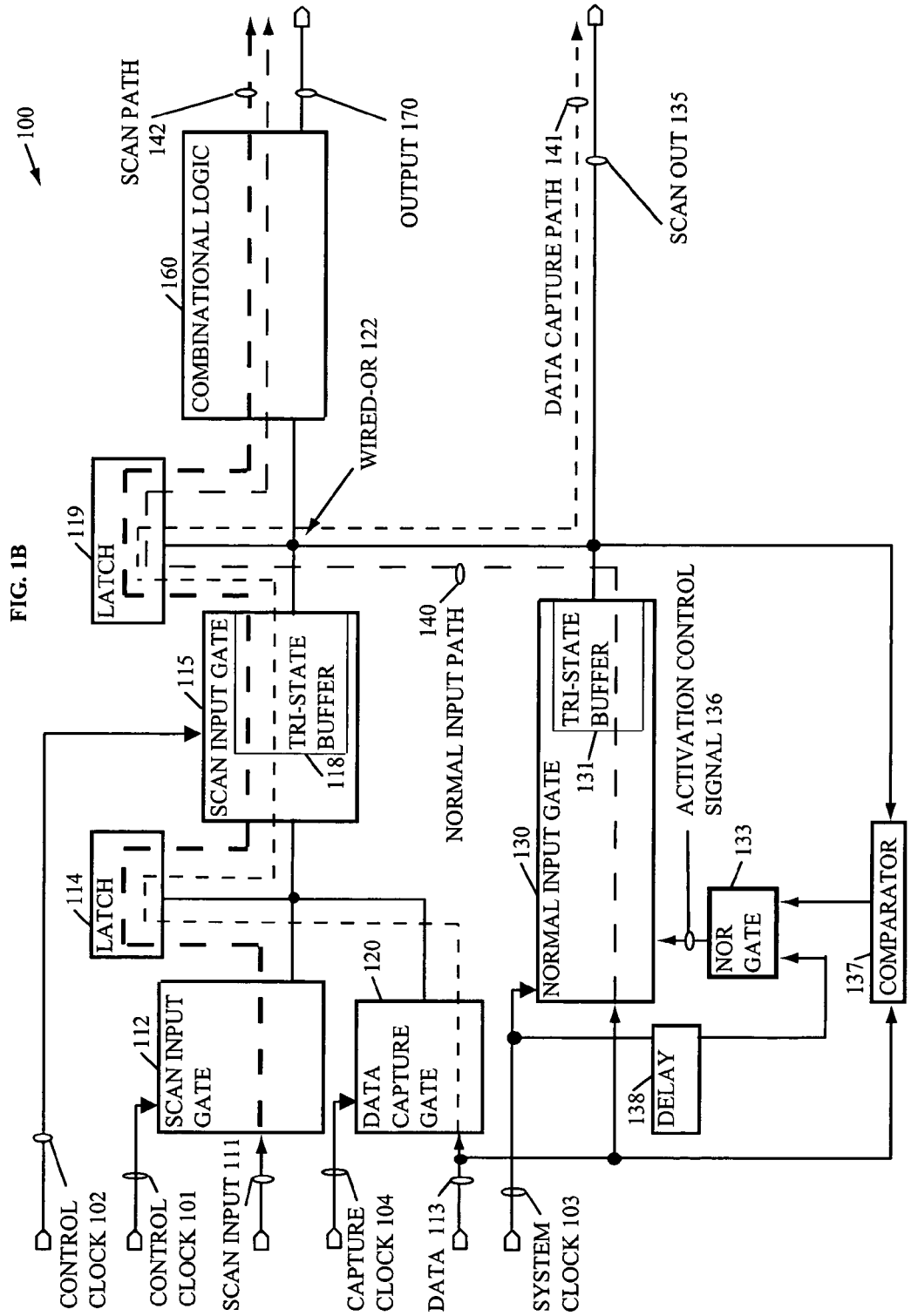
FIG. 1B depicts an embodiment of the scanable latch circuit in FIG. 1A having separate scan and normal input paths enabled via tri-state buffers and a wired-or interconnection between the outputs.

FIG. 1B depicts a more detailed embodiment of scanable latch circuit 100 having a separate scan path 142 and normal input path 140 facilitated by tri-state buffers 118 and 131 as well as a wired-or 122 interconnection between the outputs of a scan input gate 115 and a normal input gate 130. More specifically, scanable latch circuit 100 includes two latches, latches 114 and 115, to propagate bit patterns along scan path 142. Upon gating the bit patterns into the latches, combinational logic 160 may be tested via the contents of latch 119 and the resulting data may be output via output 170. The bit patterns utilized to test combinational logic 160 may also be output via scan out 135 to subsequent latches in system 196 and to analysis circuit 194. In addition, scanable latch circuit 100 may receive data 113 output by previous combinational logic circuit 182 in system 196 and capture the data 113 via a data capture path 141 when data 113 is the result of diagnostics, or a normal input path 140 when data 113 is the result of normal logic operations.

Scan Mode

In the scan mode, scan path 142 receives scan input 111 and propagates scan input 111 through scan input gate 112, latch 114, scan input gate 115, latch 119, and combinational logic 160 to create output 170. More specifically, when scan input gate 112 is turned on by control clock 101, scan input 111 is propagated via scan input gate 112 to latch 114. Then, when control clock 101 transitions low and control clock 102 transitions high, scan input gate 112 is turned off and scan input gate 115 is turned on, respectively, to transmit scan input 111 from latch 114 to latch 119 via tri-state buffer 118 and wired-or 122.

Latch 119 may maintain scan out 135, which represents the scan input for the next scanable latch circuit 183 in system 196. In particular, during the scan operation, after enabling control clock 102, control clock 101 is enabled and the data latched to latch 119 is transferred to a latch in the next scanable latch circuit 183 via scan out 135 so the bit patterns used to create output 170 may be compared with output 170 by analysis circuitry 194 and used to test the next combinational logic 185. This process may continue until the diagnostics implemented by vector generator 180 are complete. In some embodiments, the scan operation continues in conjunction with normal operations, transmitting bit patterns either periodically or continuously.

Combinational logic 160 may be any type of combinational logic. For instance, combinational logic 160 may include static logic and/or dynamic logic. Combinational logic 160 may be, e.g., part of an execution unit in an instruction pipeline and may perform an AND, a NAND, an OR, or some other logic operation.

Normal Input Mode

In the normal input mode, normal input path 140 receives data 113 and transmits data 113 to combinational logic 160 for evaluation. In particular, control clocks 101 and 102 and capture clock 104 are off and system clock 103 is on, placing tri-state buffer 118 in a high impedance state and enabling tri-state buffer 131. Normal input path 140 receives data 113 at normal input gate 130 and propagates data 113 through normal input gate 130 to scan out 135, latch 119, and combinational logic 160, in response to a transition of system clock 103.

Normal input gate 130 may include static logic or dynamic logic and may be designed to evaluate data 113 in response to a transition of the system clock 103. The output of normal input gate 130 incorporates tri-state buffer 131 to transmit the output to combinational logic 160. Advantageously, because scan path 142 and normal input path 140 are separate paths, system clock 103 and data 113 may be coupled directly to the input of normal input gate 130, potentially gating data 113 to combinational logic circuit 160 without introducing any gate delays beyond the gate delay associated with normal input gate 130.

In some embodiments, such as embodiments in which normal input gate 130 includes dynamic logic, the state of wired-or 122 is also transmitted to comparator 137. Comparator 137 may compare the data 113 to the state of wired-or 122 to determine whether data 113 will change the state of wired-or 122 when propagated through normal input gate 130. If data 113 will not change the state of wired-or 122, operations by normal input gate 130 may advantageously be stopped or reduced to conserve power. For instance, in embodiments that implement normal input gate 130 with dynamic logic, the dynamic node may discharge each cycle of system clock 103. However, when activation control signal 136 indicates that data 113 will not change the state of wired-or 122, discharge of the domino node may be blocked, reducing power consumption by scanable latch circuit 100.

Delay 138, in the present embodiment, is designed to delay system clock 103 to define the evaluation period for the dynamic logic of normal input gate 130. Further, nor gate 133 may be included to control the normal input gate 130 based upon delay 138 and comparator 137. In other embodiments, a NAND gate may be implemented to control normal input gate 130 if, e.g., activation control signal 136 couples with PMOS transistors rather than NMOS transistors in normal input gate 130.

Data Capture Mode

In the data capture mode, data capture path 141 receives data 113 when control clocks 101 and 102 and system clock 103 transition to low voltage, and capture clock 104 transitions to a high voltage. Data 113 may include evaluated data from a previous pipeline stage, previous combinational logic 182, and may be gated through data capture gate 120 to latch 114. After data 113 is latched at latch 114, control clock 102 transitions to high, data 113 is propagated through scan input gate 115 via tri-state buffer 118 and wired-or 122 to latch 119. Then, repeated, alternating transitions of control clocks 101 and 102 propagate data 113 via data capture path 141 through scan out 135 and to analysis circuitry 194.

Figure 1C:
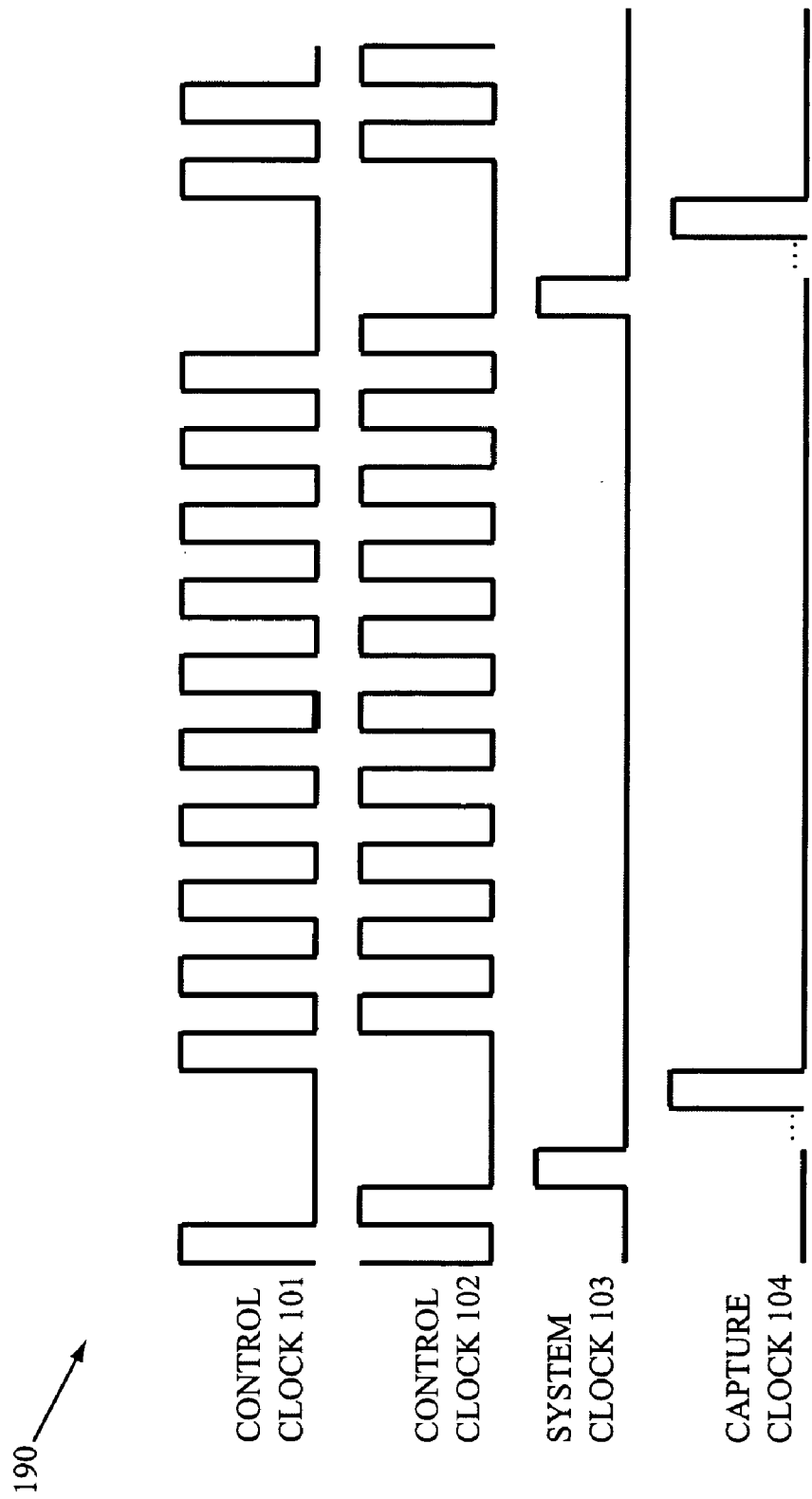
FIG. 1C depicts an example of a clock diagram for clocks of the embodiment shown in FIGS. 1A–B wherein a scan path includes a vector generator, ten latches, and analysis circuitry.

As a further illustration, FIG. 1C illustrates a clock diagram 190 for control clock 101, control clock 102, system clock 103, and capture clock 104. Clock diagram 190 describes embodiments of pulse clock signals, for clarity. The pulse clock signals may be, e.g., captured pulses from clock signals. In other embodiments, clock signals 101, 102, 103, and 104 may include continually alternating signals and, in such embodiments, triggers to operate circuit elements of scanable latch circuit 100 may rely on transitions and/or states of more than one of the continually alternating clock signals.

System 196 may be a processor pipeline and may include ten scanable latch circuits rather than three. Vector generator 180 creates a bit pattern to propagate through ten scanable latches of system 196. When control clock 101 transitions to a high voltage, a bit at scan input 111 is gated through scan input gate 112 to latch 114. Control clock 101 transitions low to turn off scan input gate 112 and to turn on scan input gate 115, gating the bit to latch 119. Then, after control clock 101 transitions to a high voltage again, the bit in latch 119 is transferred via scan out 135 to a latch of the next scanable latch circuit 183, and so on through the tenth scanable latch circuit to analysis circuitry 194.

Propagating bit patterns through the ten scanable latch circuits pre-determines the state of the latches in the ten scanable latch circuits. Thereby, propagating bit patterns through the ten scanable latch circuits can vary the states of the ten scanable latch circuits and each different state may determine a different output for combinational logic. After the states of the ten scanable latch circuits are determined, system clock 103 transitions to a high voltage. Combinational logic 160 is then evaluated and the output 170 is transmitted to analysis circuitry 194 via the data capture path of the next scanable latch 183. Analysis circuitry 194 compares the results with expected results for combinational logic 160 based upon the bit patterns and if the results differ from the expected results, there is a failure associated with combinational logic 160.

Wired-or Circuitry

Wired-or circuitry may include tri-state buffers 118 and 131, also commonly referred to as Hi-Z buffers, and may be designed to quickly switch interconnections between the scan path 142 and the normal input path 140. In the present embodiment, wired-or 122 is a physical connection between lines of the scan path 142 and the normal input path 140. In other embodiments, additional circuit elements may be incorporated to couple the scan path 142 with the normal input path 140.

Wired-or 122 is termed a wired-or based upon the intended function of the interconnection. In particular, wired-or 122 is intended to couple either the output of scan input gate 115 to latch 119 and combinational logic 160 or the output of normal input gate 130 to latch 119 and combinational logic 160.

Tri-state buffer 118 may be designed to couple the output of scan input gate 115 to wired-or 122 when in the scan mode and to isolate wired-or 122 from scan input gate 115 with a high impedance when in normal input mode. More specifically, when in scan mode, tri-state buffer 118 is designed to couple the output of scan input gate 115 to latch 119 and, when in normal input mode, tri-state buffer 118 is designed to prevent scan input gate 115 from affecting the transmission of data from normal input gate 130 to latch 119.

Tri-state buffer 131, like tri-state buffer 118, has at least three states. In normal input mode, tri-state buffer 131 may electrically couple the output of normal input gate 130 with latch 119 to transmit the results of evaluation of data 113. In the scan mode, on the other hand, tri-state buffer 131 may substantially isolate latch 119 from normal input gate 130 via a high impedance such as a reverse biased PN junction.

Figure 2:
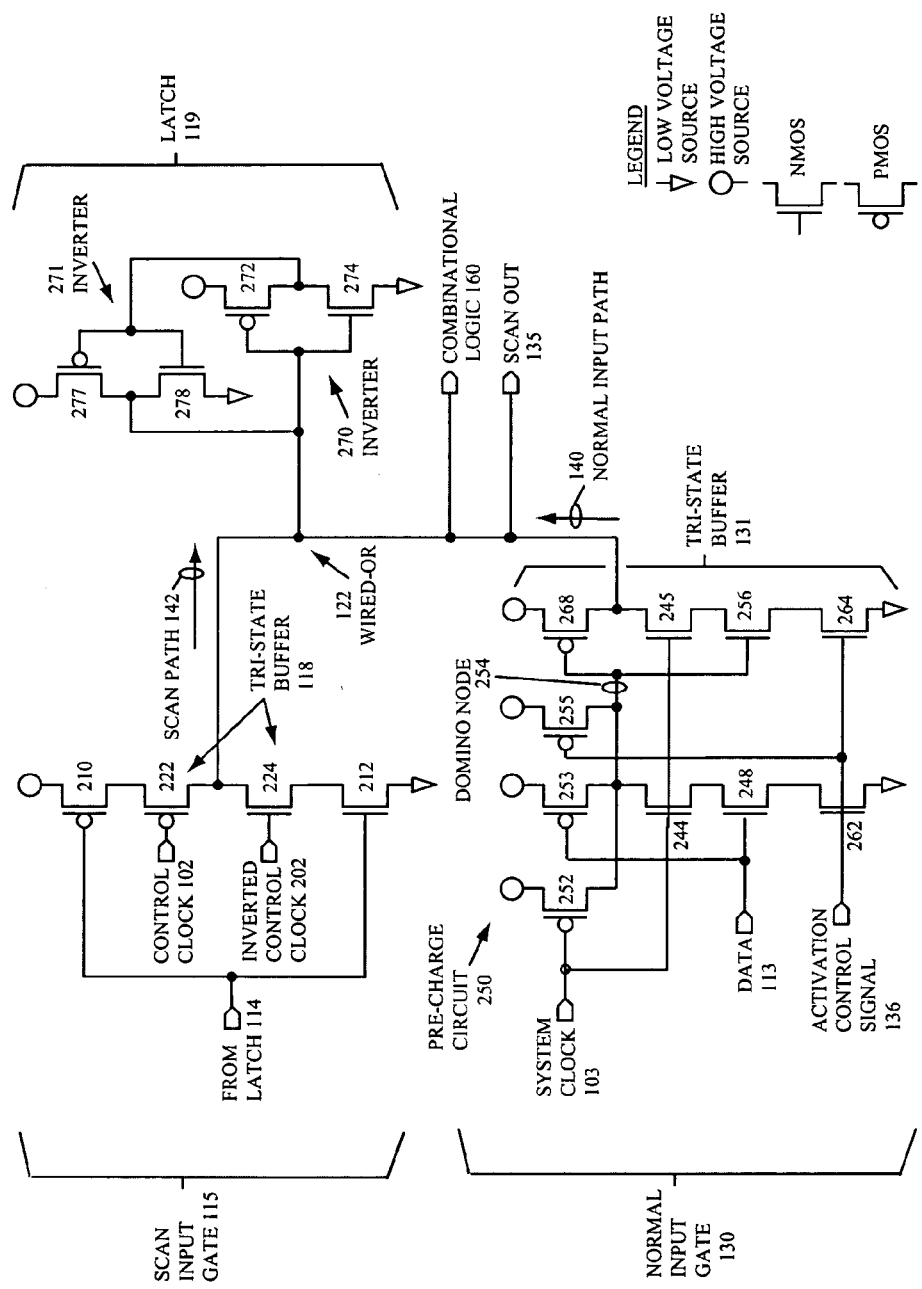
FIG. 2 depicts an example of the scanable latch circuit in FIG. 1B having dynamic logic.

FIG. 2 depicts an example of a transistor-level circuit, device 200, for the interconnection between scan input gate 115, normal input gate 130, latch 119, and wired-or 122 of the scanable latch circuit 100 in FIG. 1B. Device 200 may be configured to latch data from wired-or 122 to scan out 135 and/or to combinational logic 160 via latch 119. In particular, device 200 may include two modes of operation: a scan mode and a normal input mode. In the scan mode, data from latch 114 may be gated to latch 119 via a tri-state buffer 118 and scan path 142. In the normal input mode, data dependent upon data 113 may be gated to latch 119 via a tri-state buffer 131 and normal input path 140.

Scan Mode

With regard to the scan mode, the state of latch 114 is gated via transistors 210 and 212 and tri-state buffer 118 to scan path 142 when control clock 102 is high. For example, when latch 114 is a high voltage, a p-type (PMOS) transistor 210 is turned off and an n-type (NMOS) transistor 212 is turned on. Further, control clock 102 is a high voltage and inverted control clock 202 is a low voltage, turning on both PMOS transistor 222 and NMOS transistor 224, to pull down scan path 142 to a low voltage.

Alternatively, when latch 114 is a low voltage, PMOS transistor 210 is turned on and NMOS transistor 212 is turned off. Further, when control clock 102 is a high voltage, PMOS transistor 222 and NMOS transistor 224 are both turned on, pulling up scan path 142 to a high voltage.

Normal Input Mode

Looking now toward normal input path 140, normal input gate 130 represents a dynamic logic, transistor-level implementation of the normal input gate 130 block from FIG. 1B. Normal input gate 130 may advantageously receive system clock 103 and data 113 as direct inputs. For instance, in many embodiments, few or no gates reside between the input pin of system clock 103 and normal input gate 130, reducing delays associated with normal input path 140.

Normal input gate 130 includes dynamic logic to further increase the speed of device 200. In particular, data 113 may be received prior to a transition from a low voltage to a high voltage of system clock 103. Thus, normal input gate 130 may be ready to evaluate data 113 prior to receipt of system clock 103.

Pre-charge circuit 250 includes PMOS transistor 252 to couple a high voltage to domino node 254 when system clock 103 is low, pre-charging domino node 254. Further, to maintain a pre-charge on domino node 254, PMOS transistor 253 pre-charges domino node 254 while data 113 is low, and PMOS transistor 255 holds the charge on domino node 254 between evaluations.

Upon receipt of the transition from a low voltage to a high voltage by system clock 103, PMOS transistor 252 is turned off, isolating domino node 254 from the high voltage source. Until the activation control signal 136 transitions to a low voltage, NMOS transistors 262 and 264 are turned on and PMOS transistor 255 is turned off. And, if data 113 is high, turning on NMOS transistor 248, PMOS transistor 253 is also turned off to isolate domino node 254 from the high voltage source so that domino node 254 can be discharged via NMOS transistors 244, 248, and 262 to the low voltage source.

In general, when device 200 is in the normal input mode, normal input gate 130 is designed to discharge domino node 254 when data is a high voltage and to maintain the charge on domino node 254 when data 113 is a low voltage, switching the output to wired-or 122 between a high voltage and a low voltage, respectfully, via the normal input path 140. However, in the present embodiment, activation control signal 136 couples with NMOS transistors 262 and 264 to reduce power consumption by normal input gate 130 when data 113 does not change the state of wired-or 122, as depicted in FIG. 1B. More specifically, when comparator 137 determines that data 113 will not change the state of wired-or 122, activation control signal 136 is a low voltage, turning off NMOS transistors 262 and 264, and thus, deactivating normal input gate 130. Advantageously, deactivating normal input gate 130 reduces power consumption of device 200 by preventing the unnecessary discharge of domino node 254.

The output of normal input gate 130 is integrated with tri-state buffer 131 to output data resulting from the evaluation of data 113 or to substantially isolate wired-or 122 from normal input gate 130 when device 200 is in the scan mode. In particular, when device 200 is in scan mode, the system clock 103 is a low voltage, turning off or leaving off NMOS transistors 244 and 245 and domino node 254 is high, turning off PMOS transistor 268. When transistor 245 or 264 is off and transistor 268 is off, tri-state buffer 131 is in a high impedance state that does not affect or insignificantly affects the data transferred via wired-or 122.

Wired-or Circuitry

Control clock 102 coordinates the state of tri-state buffer 118 and system clock 103, data 113, and activation control signal 136 coordinate the state of tri-state buffer 131 such that one of tri-state buffers 118 and 131 is in a tri-state or high impedance state while the other of tri-state buffers 118 and 131 couples data to wired-or 122. Advantageously, the interconnection wired-or 122 in conjunction with tri-state buffers 118 and 131 facilitate the dual paths for bit patterns and data associated with diagnostic and normal logic operations.

More specifically, when device 200 is in scan mode, control clock 102 is a low voltage and inverted control clock 202 is a high voltage, turning on tri-state buffer 118 to gate the state of latch 114 to wired-or 122 via scan path 142. Also, while in scan mode, domino node 254 is charged to a high voltage, turning off PMOS transistor 268, and system clock 103 is low, turning off NMOS transistor 245.

On the other hand, when device 200 is in normal input mode and activation control signal is a high voltage, turning on NMOS transistors 262 and 264, tri-state buffer 131 is turned on. In particular, when device 200 is in normal input mode system clock 103 is a high voltage, turning on NMOS transistor 245, and domino node 254 turns on either PMOS transistor 268 or NMOS transistor 256 when domino node is a high voltage or a low voltage, respectively.

At the same time, control clock 102 is high and inverted control clock 202 is low, turning off tri-state buffer 118. While both PMOS transistor 222 and NMOS transistor 224 are off, tri-state buffer 118 is considered to be in the high impedance mode providing a high impedance between scan path 142 and the state of latch 114 via reverse biased PN junctions.

Output Latch

Once data is coupled via wired-or 122 through the scan path 142 or the normal input path 140, wired-or 122 is either at a low voltage or a high voltage. Wired-or 122 is the input for latch 119 and latch 119 may include four transistors forming inverters 270 and 271. When wired-or 122 is at a low voltage, inverter 270 couples a high voltage to the internal node of latch 119, an input for inverter 271. In particular, the low voltage turns NMOS transistor 274 off and turns PMOS transistor 272 on, coupling a high voltage source to the input for inverter 271. PMOS transistor 277 is turned off by the high voltage and NMOS transistor 278 is turned on, coupling the low voltage source to wired-or 122 to maintain, or latch, the low voltage at the scan out 135.

Alternatively, when wired-or 122 is at a high voltage, PMOS transistor 272 is turned off and NMOS transistor 274 is turned on, coupling the low voltage source to the input for inverter 271. With regards to inverter 271, NMOS transistor 278 is turned off and PMOS transistor 277 is turned on, coupling a high voltage source to wired-or 122.

Note that other embodiments provide the same or similar functionality with different configurations of circuit elements like the PMOS and NMOS transistors. Other embodiments may include static logic rather than dynamic logic for normal input gate 130. Some embodiments that incorporate dynamic logic do not include functionality to reduce power consumption based upon activation control signal 136. And, many embodiments incorporate different configurations of circuit elements to implement the functionality of tri-state buffers 118 and 131.

Figure 3:
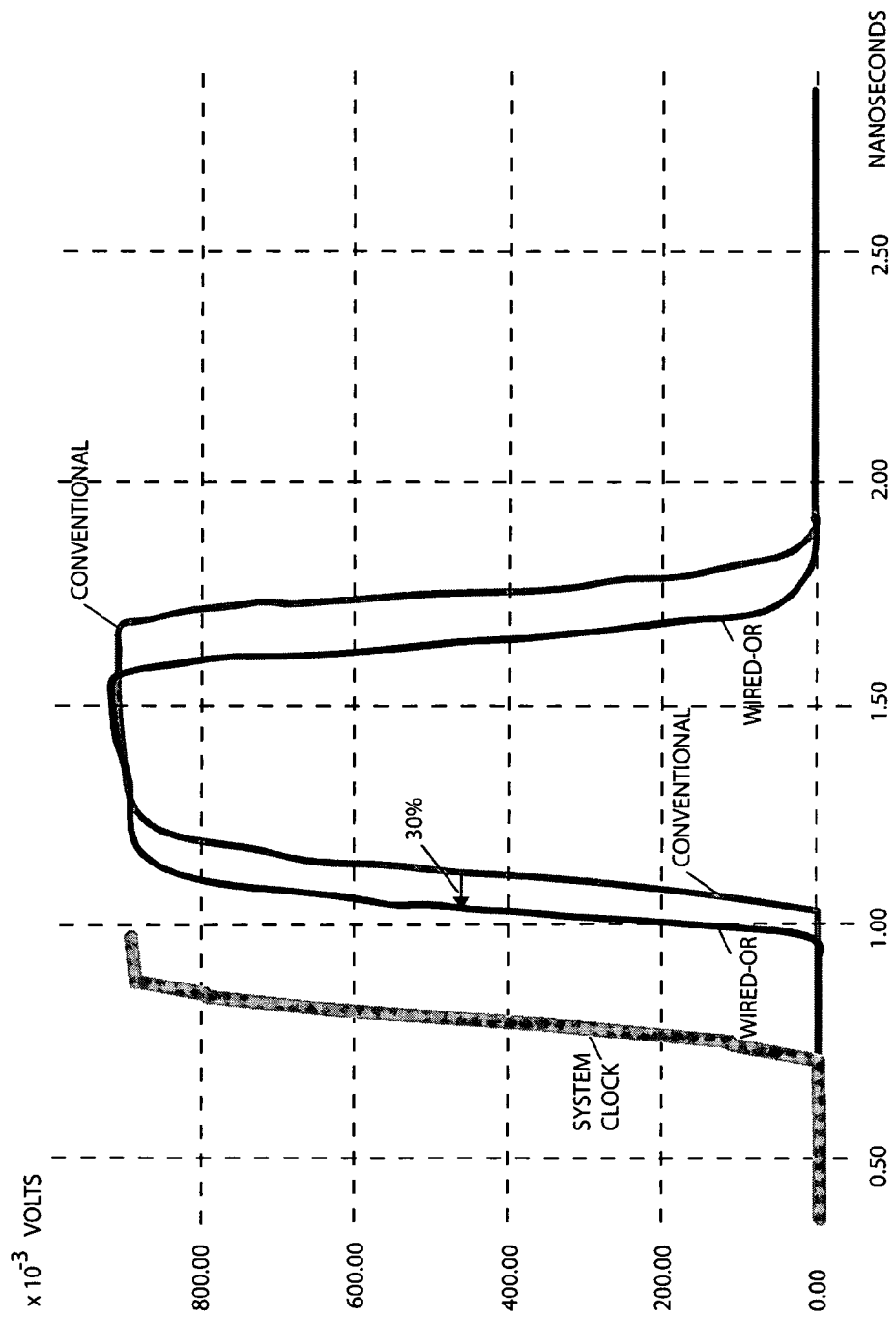
FIG. 3 depicts a graph describing an increase in latching speed upon a transition of the system clock over a conventional latch that lacks separate scan and normal input paths.

FIG. 3 depicts a graph 300 describing an increase in latching speed of scanable latch circuit 100 via normal input gate 130 upon a transition of a system clock as compared with a conventional scanable latch circuit that does not have separate scan and normal input paths. In particular, the graph labeled "system clock" represents a system clock initiating evaluation of a data signal, the graph labeled "wired-or" is the performance of scanable latch circuit 100, and the graph labeled "conventional" is the performance of a conventional, scanable latch circuit. In the conventional, scanable latch circuit, the clock is propagated through six gates between the input pin for the system clock and the normal input gate. Further, in the conventional scanable latch circuit, static logic is implemented for the normal input gate rather than dynamic logic.

Note that the wired-or, scanable latch circuit begins evaluation of data about 30% sooner than the conventional, scanable latch in response to the transition of the system clock in a circuit simulation wherein the scanable latch circuit's high voltage is at 0.9 volts and the ambient temperature is at 125 degrees Celsius. Subsequent testing has shown improvements of approximately 50% under worse conditions. The wired-or, scanable latch circuit begins to evaluate data sooner because of the direct connection between the input pin for system clock 103 and normal input gate 130. The wired-or, scanable latch circuit also evaluates the data faster because of the use of dynamic logic rather than static logic for normal input gate 130.

Referring now to FIG. 4, there is shown an example of a flow chart 400 to reduce delays in evaluation for logic having a scanable latch circuit like the scanable latch circuit 100 shown in FIG. 1B. Flow chart 400 begins with transmitting a system clock signal directly to a normal input gate, scan control clocks to scan input gates, a data signal directly to the normal input gate, and a scan input signal to a scan input gate (element 410). The combination of clock signals determines whether the scanable latch circuit is, e.g., in a scan mode, a normal input mode or a data capture mode such as the modes of operation as described in conjunction with scanable latch circuit 100 of FIG. 1. For example, the system clock signal is received from a clock circuit and is transmitted directly to the input of the normal input gate to avoid delays associated with routing the system clock through gates. Direct receipt of an enabled system clock signal and the data signal may initiate evaluation of the data signal as early as possible.

When the scanable latch circuit is in normal input mode (element 420), the system clock 103 is enabled and the transistors of a scan path, tri-state buffer like tri-state buffer 118 are turned off (element 425). Then, the data signal input for the normal input gate is compared with the data at the output of combinational logic like combinational logic 160 of FIG. 1, to determine whether evaluation of the data signal will result in changing the data at the output of the normal input gate (element 430), i.e., the state of the wired-or node. If the state of the wired-or node will not change, discharge of the domino node is avoided. If the state of the wired-or node will change, the data signal is evaluated (element 435) and the tri-state buffer at the output of the normal input gate, such as tri-state buffer 131, is turned on to allow the dynamic logic circuit to output data to the output latch (element 440).

On the other hand, when the scanable latch circuit is in scan mode rather than normal input mode (element 420), the transistors of the tri-state buffer in the normal input path, or the output of the normal input gate, are turned off (element 450). Then, the scan data from a scan input gate such as scan input gate 115 from FIG. 1, is latched to the output latch, such as latch 119 of FIG. 1 (element 455). The transistors of the tri-state buffer for the scan path, such as tri-state buffer 118, are then turned on to couple the output from the scan input gate to the output latch (element 460).

It will be apparent to those skilled in the art having the benefit of this disclosure that the present invention contemplates methods and arrangements for enhancing a scanable latch. It is understood that the form of the invention shown and described in the detailed description and the drawings are to be taken merely as examples. It is intended that the following claims be interpreted broadly to embrace all the variations of the example embodiments disclosed.

What is claimed is:

1. A wired-or circuit for a scanable latch, the wired-or circuit comprising:
 a first latch coupled to latch a bit during a scan mode;
 a second latch;
 a first buffer coupled between the first latch and the second latch to propagate the bit via a scan input gate to the second latch during a scan mode and to substantially isolate the scan input gate from the second latch with a first high impedance during a normal input mode; and
 a second buffer coupled between the second latch and a normal input gate to propagate data from the normal input gate to the second latch during the normal input mode and to substantially isolate the normal input gate from the second latch with a second high impedance during the scan mode.

2. The apparatus of claim 1, wherein a data signal and a normal input path, evaluation clock are gated directly to the normal input gate to propagate the data from the normal input gate.

3. The apparatus of claim 1, wherein the first buffer comprises a first transistor having a channel coupled between a high voltage output for the scan input gate and the second latch, and a gate controlled by a scan control clock.

4. The apparatus of claim 1, wherein the first buffer comprises a second transistor having a channel coupled between a low voltage output for the scan input gate and the second latch, and a gate controlled by a scan control clock.

5. The apparatus of claim 1, wherein the second buffer comprises a third transistor having a channel coupled between a high voltage source and the second latch, and a gate coupled with an output of the normal input gate.

6. The apparatus of claim 1, wherein the second buffer comprises a fourth transistor having a channel coupled between a low voltage source and the second latch, and a gate coupled with an output of the normal input gate.

7. A wired-or circuit for a scanable latch, the wired-or circuit comprising:
an input latch to latch a bit to a scan path;
an output latch having an input coupled with the scan path and a normal input path;
a first buffer to couple the input latch via a scan input gate to the scan path; and
a second buffer to couple an output of a normal input gate with the normal input path, wherein the first buffer is configured to remain in a high impedance state while data from the output of the normal input gate is propagated to the output latch via the normal input path and the second buffer is configured to remain in the high impedance state while the bit from the input latch is propagated to the output latch via the scan path.

8. The wired-or circuit of claim 7, wherein a data signal and a normal input path, evaluation clock are gated directly to the normal input gate to propagate the data from the output for the normal input gate.

9. The wired-or circuit of claim 7, wherein the first buffer comprises at least two transistors configured to latch a voltage source to the scan path to transmit the bit from the input latch to the output latch.

10. The wired-or circuit of claim 7, wherein the first buffer comprises at least two transistors configured to turn off to substantially isolate the scan path from a voltage source.

11. The wired-or circuit of claim 7, wherein the second buffer comprises at least two transistors configured to latch a voltage source to the normal input path to transmit data from the output of the normal input gate to the output latch.

12. The wired-or circuit of claim 7, wherein the second buffer comprises at least two transistors configured to turn off to substantially isolate the scan path from a voltage source.

13. A normal input gate for gating a data signal to a latch of the scanable latch circuit, the normal input gate comprising:
a pre-charge circuit to pre-charge a dynamic node before the data signal is evaluated;
a logic transistor having a gate coupled with the data signal to discharge the dynamic node when the normal input gate is activated; and
an output to couple a voltage source to the latch based upon a charge on the dynamic node;
wherein the data signal and a system clock are gated directly to the normal input gate to evaluate the data signal.

14. The normal input gate of claim 13, further comprising a first transistor having a channel coupled between the logic transistor and a low voltage source, and a gate coupled with a comparator to deactivate the normal input gate.

15. The normal input gate of claim 13, further comprising a second transistor having a channel coupled between the output and a low voltage source and a gate coupled with a comparator to deactivate the normal input gate.

16. The normal input gate of claim 13, wherein the output comprises at least two transistors to turn off when in a scan mode, wherein the at least two transistors substantially isolate the normal input gate from the latch when turned off.

17. A scanable latch circuit, comprising:
an output latch;
an input latch having a scan data output;
a normal input gate to output logic data based upon a data signal; and
a wired-or circuit having a first buffer coupled between the output latch and the scan data output to transmit scan data to the output latch during a scan mode and to substantially isolate the output latch from the scan data output with a first high impedance during a normal input mode; and a second buffer coupled between the output latch and an output for the normal input gate to transmit the logic data to the output latch during the normal input mode and to substantially isolate the output latch from the output for the normal input gate with a second high impedance during the scan mode.

18. The scanable latch circuit of claim 17, wherein the normal input gate comprises dynamic logic.

19. The scanable latch circuit of claim 18, further comprising a comparator to determine whether the data signal, upon evaluation by the normal input gate, will change a current state of the output latch.

20. The scanable latch circuit of claim 17, wherein the data signal and a normal input path, evaluation clock are gated directly to the normal input gate to output the logic data.

21. The scanable latch circuit of claim 17, wherein the first buffer comprises a tri-state buffer.

22. A method for switching between scan path and normal input path operations in a scanable latch circuit, the method comprising:
transmitting a data signal to a normal input gate;
transmitting a system clock signal to the normal input gate via a path that is substantially independent of a path to a scan input gate;
evaluating the data signal via the normal input gate; and
turning on a transistor of a normal input, high impedance buffer to couple an output of the normal input gate to an output latch and turning off transistors of a scan input, high impedance buffer, wherein the high impedance buffers are in a normal input mode.

23. The method of claim 22, wherein further comprising turning on a transistor of the scan input, high impedance buffer to couple an input latch via the scan input gate to the output latch and turning off transistors of the normal input, high impedance buffer, wherein the high impedance buffers are in a scan mode.

24. The method of claim 22, further comprising blocking evaluation by the normal input gate based upon the data signal.

25. The method of claim 24, wherein blocking evaluation comprises turning off a blocking transistor coupled between the normal input gate and a low voltage source to prevent a dynamic node of the normal input gate from discharging.

26. The method of claim 25, wherein blocking evaluation comprises comparing the data signal to a current state of the output latch to determine whether the data signal will change the current state.

27. The method of claim 22, wherein transmitting the data signal comprises transmitting the data signal directly to the normal input gate and transmitting the system clock comprises transmitting the system clock directly to the normal input gate.

* * * * *

UNITED STATES PATENT AND TRADEMARK OFFICE
CERTIFICATE OF CORRECTION

PATENT NO. : 6,972,598 B2
DATED : December 6, 2005
INVENTOR(S) : Seung-Moon Yoo

It is certified that error appears in the above-identified patent and that said Letters Patent is hereby corrected as shown below:

<u>Column 12,</u>
Line 57, after "The method of claim 22," delete "wherein".

Signed and Sealed this

Twenty-third Day of May, 2006

JON W. DUDAS
*Director of the United States Patent and Trademark Office*